(12) United States Patent
Xie et al.

(10) Patent No.: US 9,130,029 B2
(45) Date of Patent: Sep. 8, 2015

(54) RECESSING AND CAPPING OF GATE STRUCTURES WITH VARYING METAL COMPOSITIONS

(71) Applicant: GLOBALFOUNDRIES Singapore Pte. Ltd., Singapore (SG)

(72) Inventors: Ruilong Xie, Albany, NY (US); David V. Horak, Essex Junction, VT (US); Su Chen Fan, Cohoes, NY (US); Pranatharthiharan Haran Balasubramanian, Watervliet, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/181,304

(22) Filed: Feb. 14, 2014

(65) Prior Publication Data

US 2014/0159169 A1   Jun. 12, 2014

Related U.S. Application Data

(62) Division of application No. 13/491,857, filed on Jun. 8, 2012, now Pat. No. 8,679,909.

(51) Int. Cl.
*H01L 29/66* (2006.01)
*H01L 29/78* (2006.01)
*H01L 21/28* (2006.01)
*H01L 21/768* (2006.01)

(52) U.S. Cl.
CPC ............. *H01L 29/78* (2013.01); *H01L 21/28* (2013.01); *H01L 21/28247* (2013.01); *H01L 29/66545* (2013.01); *H01L 21/76897* (2013.01)

(58) Field of Classification Search
CPC .................................. H01L 29/66545
USPC ......... 438/183; 257/330, 332, 412, E21.444, 257/E21.453, E21.621
See application file for complete search history.

(56) References Cited

U.S. PATENT DOCUMENTS

| 7,056,794 B2* | 6/2006 | Ku et al. ............. 438/287 |
| 2011/0156107 A1 | 6/2011 | Bohr et al. |
| 2012/0049247 A1* | 3/2012 | Lee et al. ............. 257/288 |

OTHER PUBLICATIONS

M. Schaepkens et al. "Study of the SiO2-to Si3N4 Etch Selectivity Mechanism in Inductively Coupled Fluorocarbon Plasmas and a Comparison With the SiO2-to Si mechanism" J. Vac Sci. Technol. A, vol. 17, No. 1, Jan./Feb. 1999, pp. 26-37.

* cited by examiner

*Primary Examiner* — David Vu
(74) *Attorney, Agent, or Firm* — Ditthavong & Steiner, P.C.

(57) ABSTRACT

A approach for recessing and capping metal gate structures is disclosed. Embodiments include: forming a dummy gate electrode on a substrate; forming a hard mask over the dummy gate electrode; forming spacers on opposite sides of the dummy gate electrode and the hard mask; forming an interlayer dielectric (ILD) over the substrate adjacent the spacers; forming a first trench in the ILD down to the dummy gate electrode; removing the dummy gate electrode to form a second trench below the first trench; forming a metal gate structure in the first and second trenches; and forming a gate cap over the metal gate structure.

5 Claims, 9 Drawing Sheets

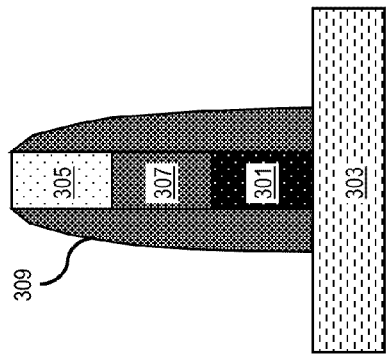
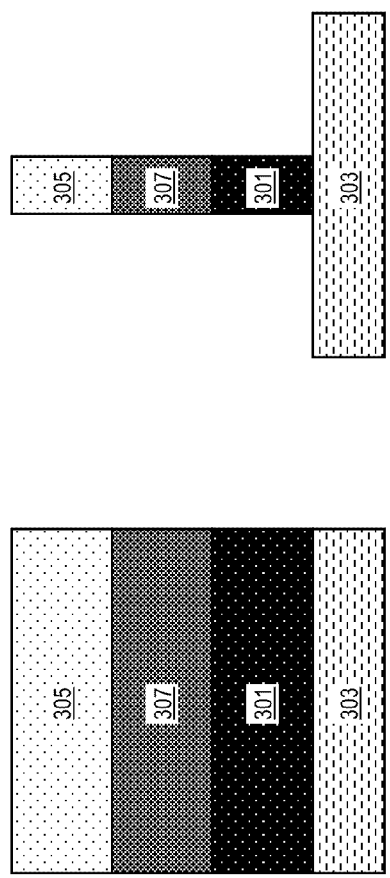
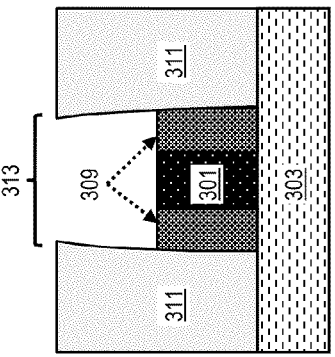
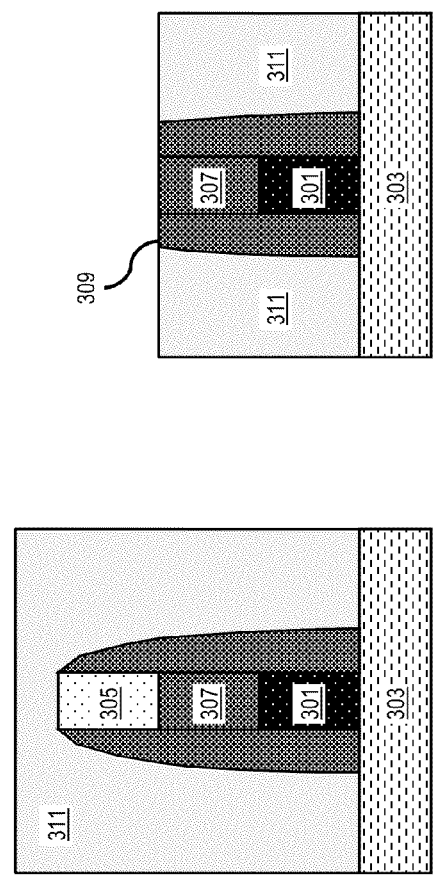
FIG. 3A  FIG. 3B  FIG. 3C  FIG. 3D  FIG. 3E  FIG. 3F

RECESSING AND CAPPING OF GATE STRUCTURES WITH VARYING METAL COMPOSITIONS

CROSS-REFERENCE TO RELATED APPLICATION

This application is a division of U.S. patent application Ser. No. 13/491,857 filed Jun. 8, 2012, the entirety of which is incorporated herein by reference.

TECHNICAL FIELD

The present disclosure relates to formation, recessing, and capping of metal gate structures in complementary metal-oxide-semiconductors (CMOS). The present disclosure is particularly applicable to formation of replacement metal gate (RMG) structures with varying metal compositions for enabling implementation of self-aligned contacts.

BACKGROUND

As technology continues to scale, devices with conventional source/drain contacts will experience severe problems with respect to shorting from gate to source/drain (e.g., due to a decrease in gate-to-gate pitch). As such, borderless source/drain contacts (or self-aligned source/drain contacts) are currently being utilized to overcome such issues. To realize borderless contacts in an RMG integration scheme, a dielectric capping layer is formed on the gate to isolate the gate from the source/drain contact. For example, FIGS. 1A through 1E schematically illustrate one approach for forming a capping layer to enable borderless contacts (or self-aligned contacts). As shown, in FIG. 1A, a device may include gate structure 101, high-k dielectric layer 103, nitride spacers 105 on opposite sides of gate structure 101, source/drain regions 107, oxide 109 adjacent nitride spacers 105, and substrate 111 below gate structure 101. In addition, gate structure 101 may include metal gate structure 113 (e.g., made of aluminum (Al), tungsten (W), etc.) and metal liner 115 (e.g., made of work-function metals). As depicted, in FIGS. 1B and 1C, the metal gate structure 113 may be recessed, followed by a recess of metal liner 115. Then, in FIGS. 1D and 1E, nitride 117 is deposited and polished to form gate cap 119 over gate structure 101.

However, the process described in FIGS. 1B and 1C is an unlanded etch process that can usually only be achieved with a fixed time etch. It is naturally very difficult to control the metal recess process without an etch stop layer. In this case, controlling the etch depth is extremely difficult since any tool fluctuation during the fixed time etch could result in a change in etch depth. Moreover, it is even more difficult to uniformly recess gate structures with complicated metal liners. Various devices (e.g., NFET, PFET, etc.) on the same wafer may include different work-function metal liners for their gate structures, the metal liners may be of varying thickness, and metal liner material may frequently be modified based on the implemented technology. For example, FIGS. 2A through 2D schematically illustrate an example of uneven depths of metal gate structures and metal liners resulting from a typical recess of gates with varying metal compositions. By way of example, the structure in FIG. 2A may be an NMOS device, and the structure in FIG. 2B may be a PMOS device. Each device may, for instance, include gate structure 201, high-k dielectric layer 203, nitride spacers 205, source/drain regions 207, and oxide 209. As shown, the gate structure 201a of the NMOS device may include metal gate structure 213 along with metal liner 215, and the gate structure 201b of the PMOS device may include metal gate structure 217 along with metal liners 219 and 221. As shown, in FIGS. 2C and 2D, the depths of upper surfaces of the gate structures 201 of the NMOS and the PMOS device may be different after a typical recess (e.g., as depicted by indicator 225). However, to enable efficiency in the manufacturing process, recess of such complex metal compositions should be uniform across the wafer, from wafer-to-wafer, from lot-to-lot, etc.

A need therefore exists for methodology enabling recessing and capping of gate structures with varying metal compositions, along with devices formed by such methods.

SUMMARY

An aspect of the present disclosure is a method for recessing and capping gate structures with varying metal compositions with a landed etch.

Another aspect of the present disclosure is a device formed by a process for recessing and capping gate structures with varying metal compositions with a landed etch.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a dummy gate electrode on a substrate; forming a hard mask over the dummy gate electrode; forming spacers on opposite sides of the dummy gate electrode and the hard mask; forming an interlayer dielectric (ILD) over the substrate adjacent the spacers; forming a first trench in the ILD down to the dummy gate electrode; removing the dummy gate electrode to form a second trench below the first trench; forming a metal gate structure in the first and second trenches; and forming a gate cap over the metal gate structure.

Aspects of the present disclosure include forming the first trench by removing the hard mask and a portion of the spacers adjacent the hard mask. Another aspect includes: forming a high-k dielectric layer in the first and second trenches; forming one or more metal liners, over the high-k dielectric layer, in the first and second trenches; and forming the metal gate structure over the high-k dielectric layer and the metal liners. Some aspects include: recessing the metal liners proximate the ILD, with an etch stop on the spacers, the ILD, the high-k dielectric layer, or a combination thereof; and removing a first portion of the metal gate structure during the metal liner recess and a second portion of the metal gate structure by etching after the metal liner recess, prior to forming the gate cap. Further aspects of the present disclosure include: removing the metal gate structure from the first trench with an etch stop at a top of the second trench; and removing a portion of the metal liners and the high-k dielectric layer in the first trench adjacent an upper surface of remaining portions of the spacers, prior to forming the gate cap. Other aspects include: forming the gate cap by filling a remainder of the first and second trenches with dielectric cap material; removing the ILD after the forming of the gate cap; and removing the high-k dielectric layer and the metal liners around the gate cap after removing the ILD.

Certain aspects include: forming the first trench to have a first width; and forming the second trench to have a second width, wherein the first width is greater than the second width. Additional aspects include: forming the second trench between remaining portions of the spacers after forming the first trench. Various aspects include: forming a second hard mask over the hard mask; forming the spacers on sides of the second hard mask; and planarizing down to an upper surface of the hard mask prior to form the first trench. Some aspects include: forming the dummy gate electrode of polysilicon, the hard mask of a nitride, and the second hard mask of an oxide. Further aspects include forming the gate cap using a first type of dielectric material, and the spacers using a second type of dielectric material.

An additional aspect of the present disclosure is a device formed by a process including: forming a dummy gate electrode on a substrate; forming a hard mask over the dummy gate electrode; forming spacers on opposite sides of the dummy gate electrode and the hard mask; forming an ILD over the substrate adjacent the spacers; forming a first trench in the ILD down to the dummy gate electrode; removing the dummy gate electrode to form a second trench below the first trench; forming a metal gate structure in the first and second trenches; and forming a gate cap over the metal gate structure.

Another aspect of the process for forming the device includes: removing the hard mask and a portion of the spacers adjacent the hard mask to form the first trench; forming a high-k dielectric layer in the first and second trenches; forming one or more metal liners, over the high-k dielectric layer, in the first and second trenches; and forming the metal gate structure over the high-k dielectric layer and the metal liners. Some aspects include: recessing the metal liners proximate the ILD, with an etch stop on the spacers, the ILD, the high-k dielectric layer, or a combination thereof; and removing a first portion of the metal gate structure during the metal liner recess and a second portion of the metal gate structure by etching after the metal liner recess, prior to forming the gate cap. Other aspects include: removing the metal gate structure from the first trench with an etch stop at a top of the second trench; and removing a portion of the metal liners and the high-k dielectric layer in the first trench adjacent an upper surface of remaining portions of the spacers, prior to forming the gate cap. Further aspects include: forming the gate cap by filling a remainder of the first and second trenches with dielectric cap material; removing the ILD after the forming of the gate cap; and removing the high-k dielectric layer and the metal liners around the gate cap after removing the ILD.

Another aspect of the present disclosure includes: forming a dummy electrode on a substrate; forming a first hard mask of a first material over the dummy electrode; forming a second hard mask of a second material, different from the first material, over the first hard mask; forming spacers on opposite sides of the dummy electrode, the first hard mask, and the second hard mask; forming an ILD over the substrate adjacent the spacers; performing chemical mechanical polishing (CMP) on the ILD and the second hard mask down to an upper surface of the first hard mask; removing the first hard mask and adjacent portions of the spacers to form a first trench in the ILD over the dummy electrode, the first trench having a first width; removing the dummy electrode to form a second trench below the first trench, the second trench having a second width less than the first width; forming a metal gate structure in the first and second trenches; and forming a gate cap over the metal gate structure.

Further aspects include: forming a high-k dielectric layer in the first and second trenches; forming one or more metal liners, over the high-k dielectric layer, in the first and second trenches; and forming the metal gate structure over the high-k dielectric layer and the metal liners. Additional aspects include: filling the first and second trenches with metal gate material over the high-k dielectric layer and the metal liners; and recess etching the metal liners, the metal gate material, or a combination thereof with an etch stop at a top of the first trench. Other aspects include: forming the dummy electrode of polysilicon, the first hard mask of a nitride material, and the second hard mask of an oxide material.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A through 3L schematically illustrate a process flow for forming gate structures with varying metal compositions, in accordance with an exemplary embodiment of the present disclosure;

DETAILED DESCRIPTION

Figure 1A:
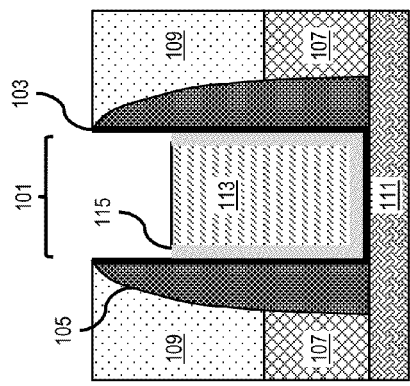
FIGS. 1A through 1E schematically illustrate one approach for forming a capping layer to enable borderless contacts (or self-aligned contacts)
Figure 1B:
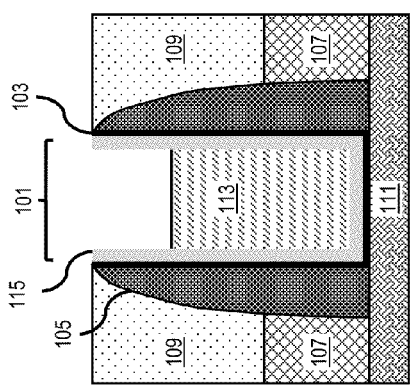
Figure 1C:
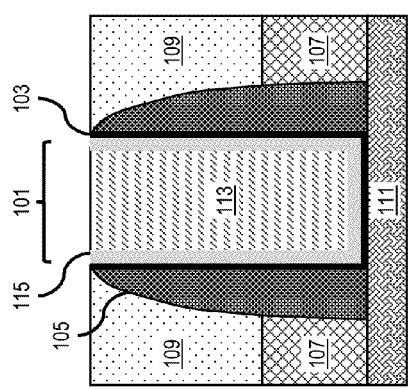
Figure 1E:
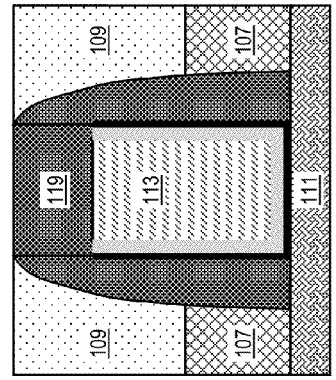
Figure 1D:
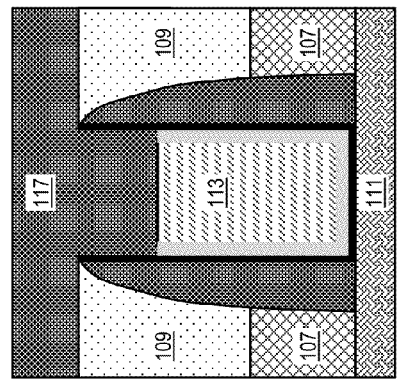
Figure 2A:
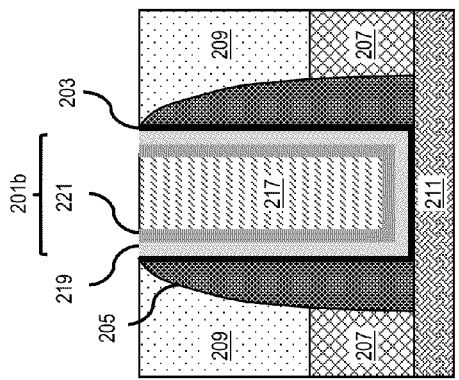
FIGS. 2A through 2D schematically illustrate an example of uneven depths of metal gate structures and metal liners resulting from a typical recess of gates with varying metal compositions.
Figure 2B:
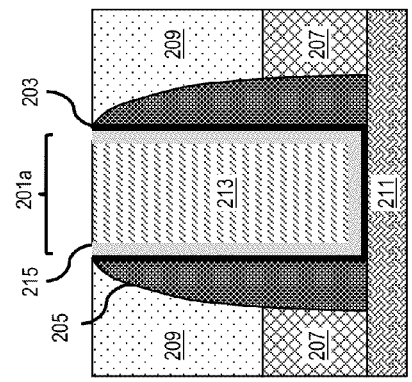
Figure 2C:
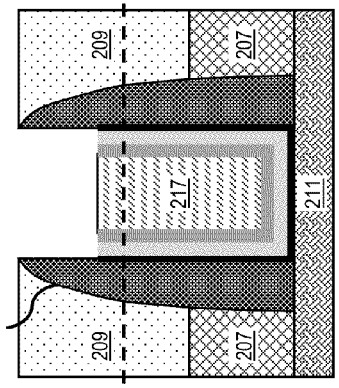
Figure 2D:
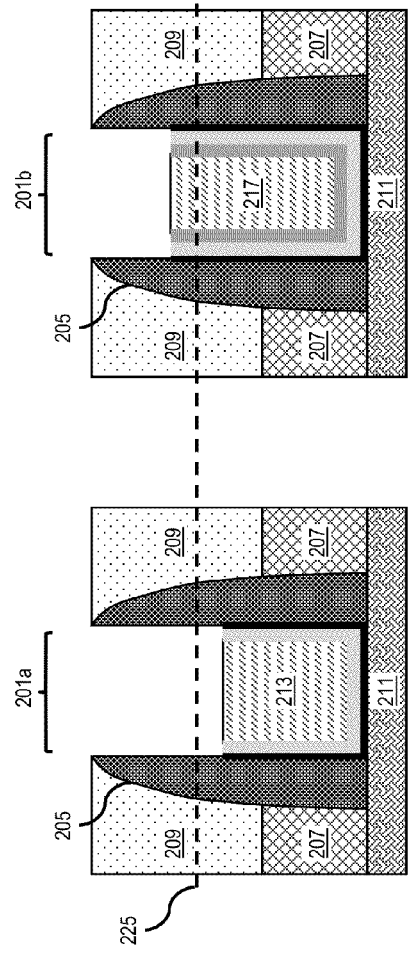

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about." Also, while planar devices are illustrated, the methods and integrated circuits are applicable to other types of devices such as FinFET devices.

The present disclosure addresses and solves problems of non-uniform etching of metal gates across a wafer, from wafer-to-wafer, and from lot-to-lot attendant upon recessing an RMG to form a capping layer to enable borderless contacts. The present disclosure addresses and solves such problems, for instance, by, inter alia, forming a dummy gate electrode on a substrate; forming a hard mask over the dummy gate electrode; forming spacers on opposite sides of the dummy gate electrode and the hard mask; forming an ILD over the substrate adjacent the spacers; forming a first trench in the ILD down to the dummy gate electrode; removing the dummy gate electrode to form a second trench below the first trench; forming a metal gate structure in the first and second trenches; and forming a gate cap over the metal gate structure.

FIGS. 3A through 3L schematically illustrate a process flow for forming gate structures with varying metal compositions, in accordance with an exemplary embodiment of the present disclosure. Adverting to FIGS. 3A and 3B, dummy gate electrode 301 may be formed over an active region of substrate 303 and oxide hard mask 305 and nitride hard mask 307 may be formed over dummy gate electrode 301. Dummy gate electrode 301, oxide hard mask 305, and nitride hard mask 307 may, for instance, be formed by depositing dummy polysilicon over the active region and depositing the respective hard mask materials over the dummy polysilicon, followed by reactive ion etching of the deposited materials. As shown, in FIGS. 3C and 3D, spacers 309 may thereafter be formed on opposite sides of dummy gate electrode 301, oxide hard mask 305, and nitride hard mask 307, followed by formation of ILD 311 adjacent spacers 309 (e.g., by depositing ILD material over substrate 303 to fill the space between dummy gate electrodes). Then, in FIG. 3E, polishing (e.g., open-poly CMP) may be performed until the upper surface of nitride hard mask 307 is reached, removing oxide hard mask 305, portions of spacers 309, and a portion of ILD 311. As depicted, in FIG. 3F, nitride hard mask 307 and further portions of spacers 309 may be removed to form trench 313 in ILD 311 over dummy gate electrode 301 and the remaining portions of spacers 309.

Figure 3G:
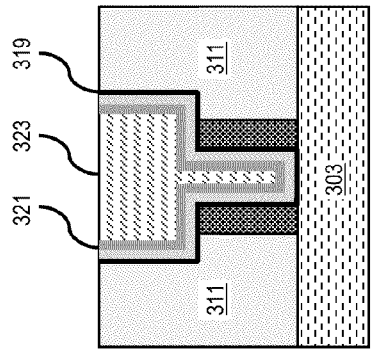
Figure 3H:
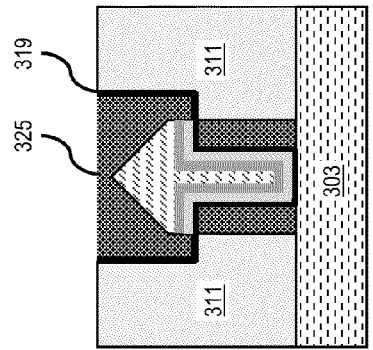
Figure 3I:
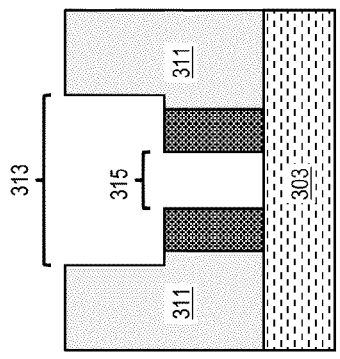
Figure 3J:
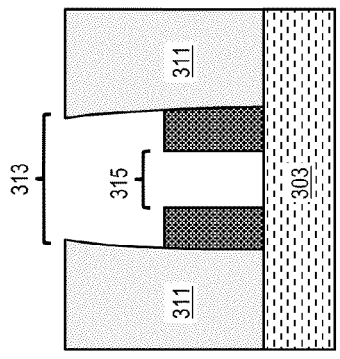
Figure 3K:
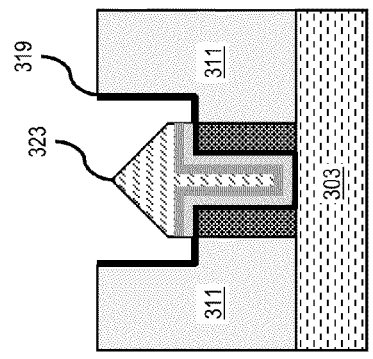
Figure 3L:
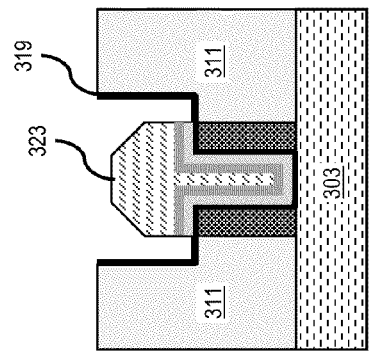

Adverting to FIG. 3G, dummy gate electrode 301 may be removed to form trench 315 below trench 313 between the remaining portions of spacers 309. As illustrated, in FIGS. 3H and 3I, a high-k dielectric pre-clean process may be performed (e.g., using a dilute hydrofluoric acid (DHF) solution to remove native oxide), followed by formation of high-k dielectric layer 319, metal liners 321, and metal gate structure 323 (e.g., by depositing the respective materials and performing CMP, after depositing, using an top surface of ILD 311, high-k dielectric layer 319, or metal liners 321 as a stop point). By way of example, high-k dielectric layer 319 may include hafnium oxide ($HfO_2$), metal liners 321 may include titanium nitride (TiN), tantalum carbide (TaC), etc., and metal gate structure 323 may include Al, silicide, W, etc. In FIG. 3J, recess etching of metal liners 321 may be performed (e.g., self-stopped at spacers 309, ILD 311, or high-k dielectric layer 319), resulting in removal of portions of metal liners 321 along with a portion of metal gate structure 323 in trench 313. In this way, issues relating to depth inconsistencies of metal liners may be eliminated since the final height of the metal liners is set by the initial dummy poly height. Then, in FIGS. 3K and 3L, recess etching of metal gate structure 323 may be performed, followed by formation of dielectric gate cap 325 over metal liners 321 and metal gate structure 323 (e.g., by depositing dielectric gate cap material in trench 313 and performing CMP). In this way, the uniformity of the gate structures may be improved since the adverse effects of varying metal compositions in the gate structures are avoided during recess etching of the gate structures.

Figure 4A:
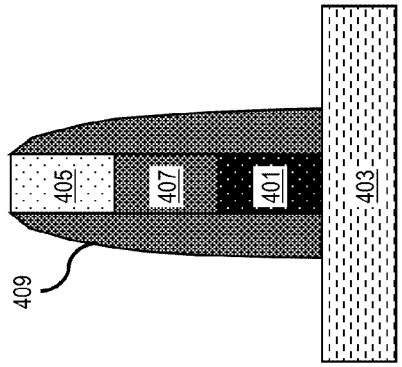
FIGS. 4A through 4Q schematically illustrate another process flow for forming gate structures with varying metal compositions, in accordance with another exemplary embodiment of the present disclosure.
Figure 4B:
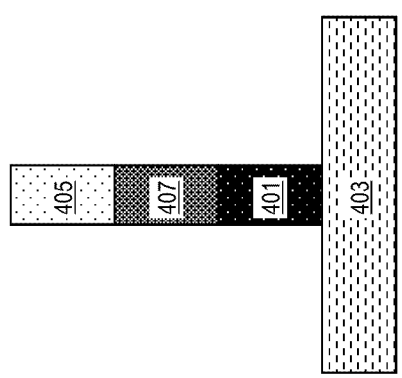
Figure 4C:
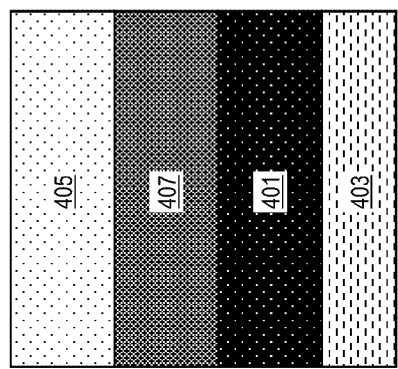
Figure 4D:
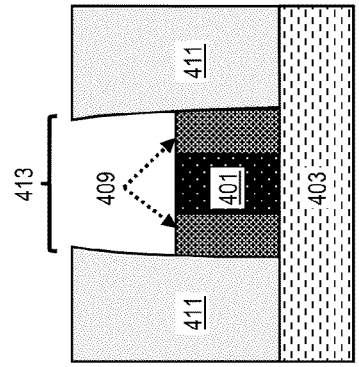
Figure 4E:
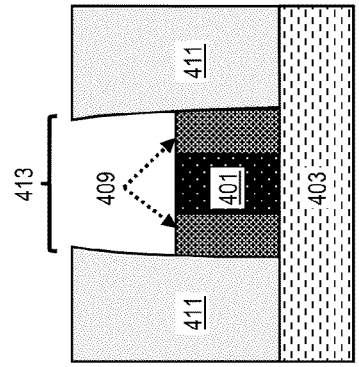
Figure 4F:
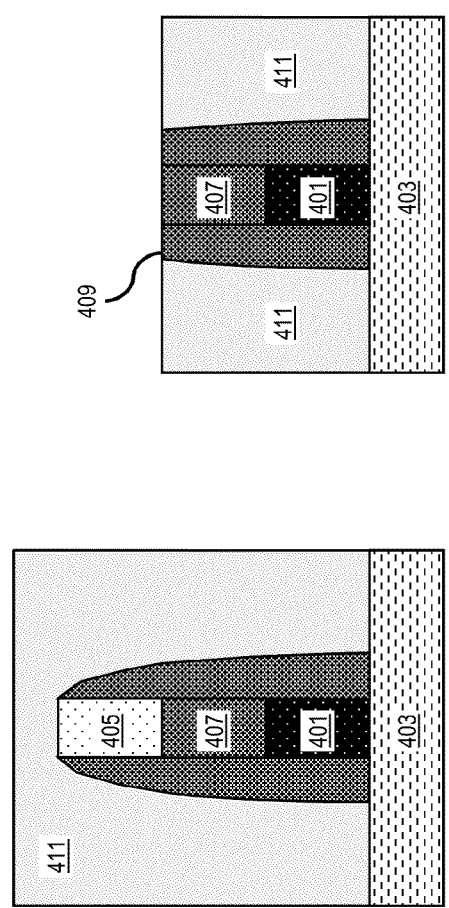
Figure 4G:
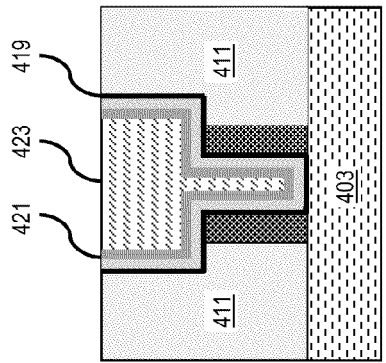
Figure 4H:
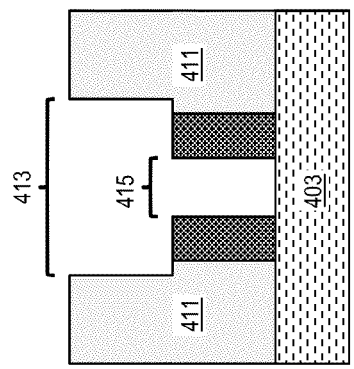
Figure 4I:
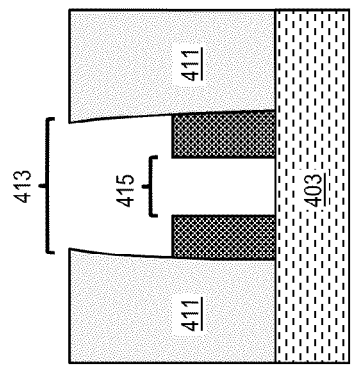
Figure 4J:
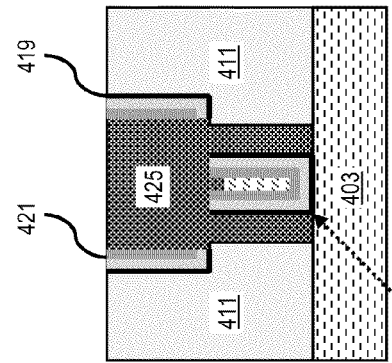
Figure 4K:
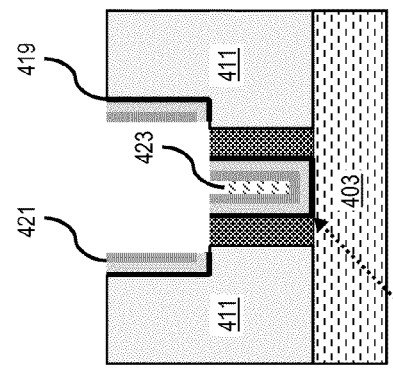
Figure 4L:
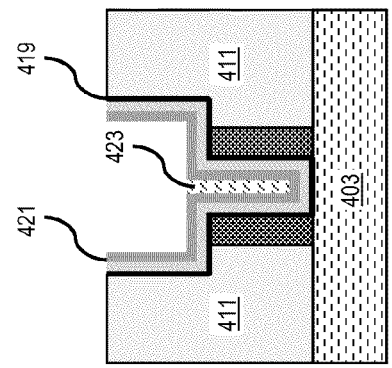
Figure 4O:
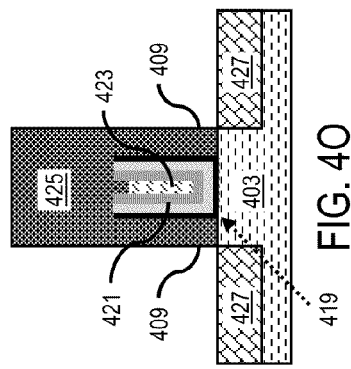
Figure 4N:
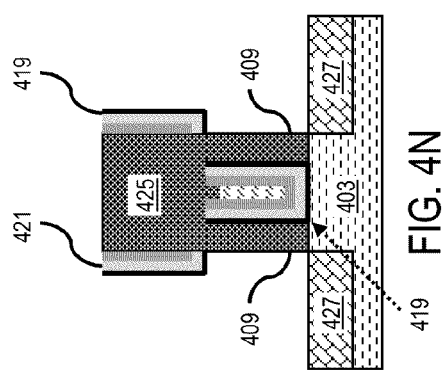
Figure 4Q:
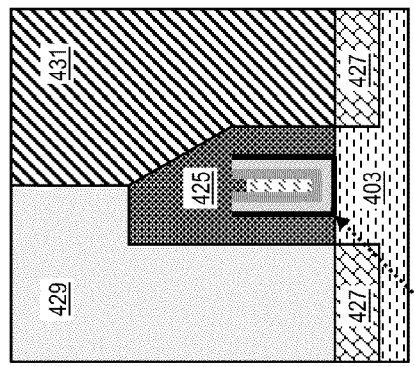

FIGS. 4A through 4Q schematically illustrate another process flow for forming gate structures with varying metal compositions, in accordance with another exemplary embodiment of the present disclosure. Adverting to FIGS. 4A and 4B, dummy gate electrode 401 may be formed over an active region of substrate 403, and oxide hard mask 305 and nitride hard mask 407 may be formed over dummy gate electrode 401. Dummy gate electrode 401, oxide hard mask 405, and nitride hard mask 407 may, for instance, be formed by depositing dummy polysilicon over the active region and depositing the respective hard mask materials over the dummy polysilicon, followed by reactive ion etching of the deposited materials. As shown, in FIGS. 4C and 4D, spacers 409 may thereafter be formed on opposite sides of dummy gate electrode 401, oxide hard mask 405, and nitride hard mask 407, followed by formation of ILD 411 adjacent spacers 409. Then, in FIG. 4E, polishing may be performed until the upper surface of nitride hard mask 407 is reached, removing oxide hard mask 405, portions of spacers 409, and a portion of ILD 411. As depicted, in FIG. 4F, nitride hard mask 407 and another portion of spacers 409 may be removed to form trench 413 in ILD 411 over dummy gate electrode 401 and the remaining portions of spacers 409.

Figure 4M:
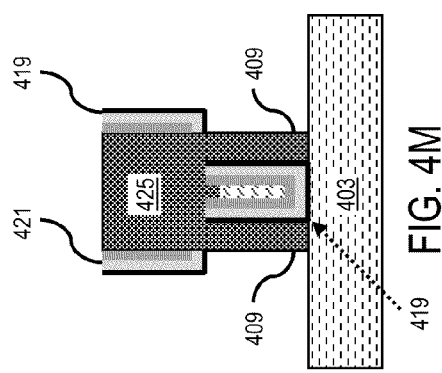
Figure 4P:
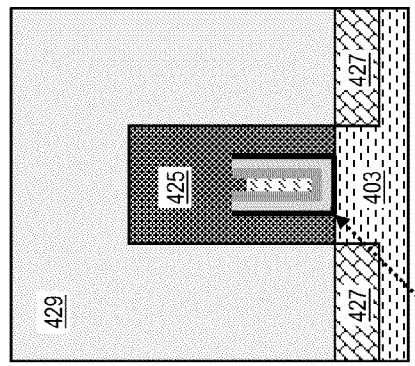
Figure 5B:
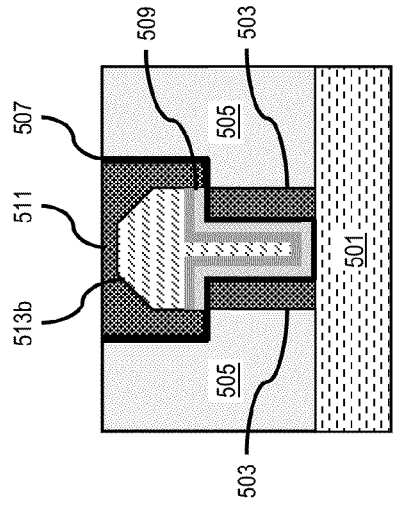
FIGS. 5A through 5D schematically illustrate various shapes of metal gate structures that may be formed based on the process flow of FIGS. 3A through 3L, in accordance with exemplary embodiments of the present disclosure.
Figure 5D:
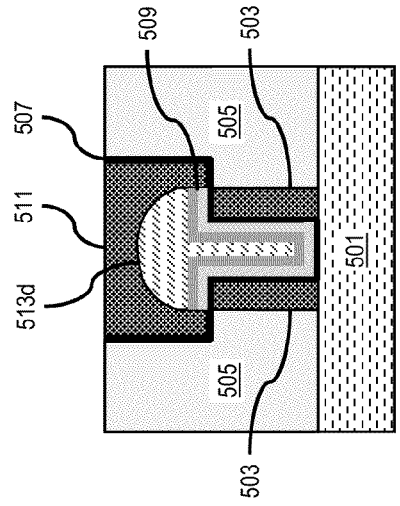
Figure 5A:
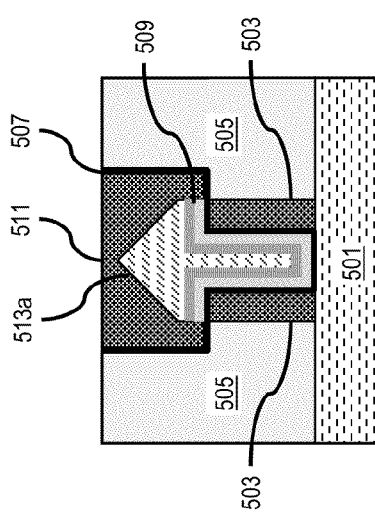
Figure 5C:
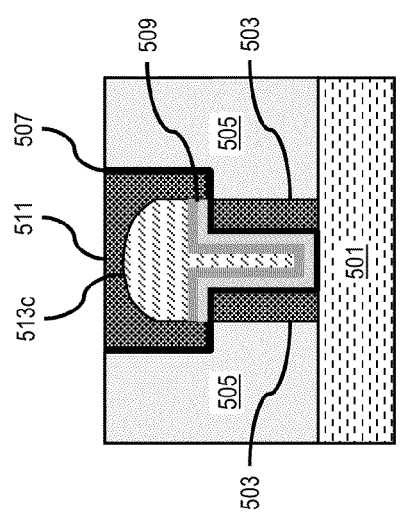

Adverting to FIG. 4G, dummy gate electrode 401 may be removed to form trench 415 below trench 413 between the remaining portions of spacers 409. As illustrated, in FIGS. 4H and 4I, a high-k dielectric pre-clean process may be performed, followed by formation of high-k dielectric layer 419, metal liners 421, and metal gate structure 423. In FIG. 4J, recess etching of metal gate structure 423 may be performed, resulting in removal of metal gate structure 423 in trench 413. End point could be set for the etch process by monitoring the metal etch byproduct signal. When the metal gate structure 423 in upper trench 413 has been etched and metal gate structure 423 in lower trench 415 is about to be etched, the metal byproduct signal will drop due to the surface area shrinkage from trench 413 to trench 415. Thus, the metal recess process can be easily controlled to improve the uniformity. Then, in FIG. 4K, an anisotropic metal liners etch (e.g., argon (Ar) sputtering) may be performed in trench 413 until an upper surface of spacers 409 is exposed. Depending on the selectivity of the anisotropic etch process, this may result in removal of a portion of metal gate structure 423 in trench 415. In other aspects, the etch process may be performed until an upper surface of high-k dielectric layer 419 is exposed. Subsequently, in FIG. 4L, dielectric gate cap 425 may be formed in trench 413 over metal liners 421 and metal gate structure 423 in trench 415. Adverting to FIGS. 4M and 4N, ILD 411 may be removed to enable silicide formation (e.g., over source/drain regions 427 in substrate 403). As illustrated in FIG. 4O, high-k dielectric layer 419 and metal liners 421 above trench 415 may be removed (e.g., by dry or wet etch, for example by aqua regia, or a sulfuric acid/hydrogen peroxide ($H_2SO_4/H_2O_2$) clean). Alternatively, the silicide formed in FIG. 4N may be formed subsequent to removal of high-k dielectric layer 419 and metal liners 421 above trench 415. Thereafter, in FIGS. 4P and 4Q, dielectric material 429 may be deposited and polished, followed by etching of dielectric material 429 and metallization to form self-aligned contact 431.

FIGS. 5A through 5D schematically illustrate various shapes of metal gate structures that may be formed based on the process flow of FIGS. 3A through 3L, in accordance with embodiments of the present disclosure. The structures of FIGS. 5A through 5D may, for instance, include substrate 501, spacers 503, ILD 505, high-k dielectric layer 507, metal liners 509, and dielectric cap 511. However, the structures of FIGS. 5A through 5D may respectively be formed with metal gate structure 513a through 513d having the different shapes.

Figure 6B:
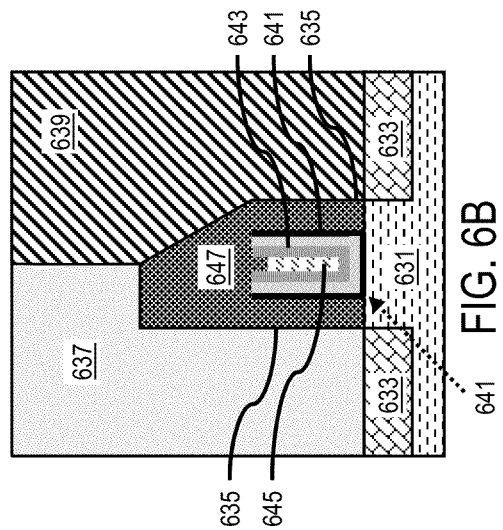
FIGS. 6A and 6B schematically illustrate additional options with respect to the process flows of FIGS. 3A through 3L and FIGS. 4A through 4Q, in accordance with exemplary embodiments of the present disclosure.
Figure 6A:
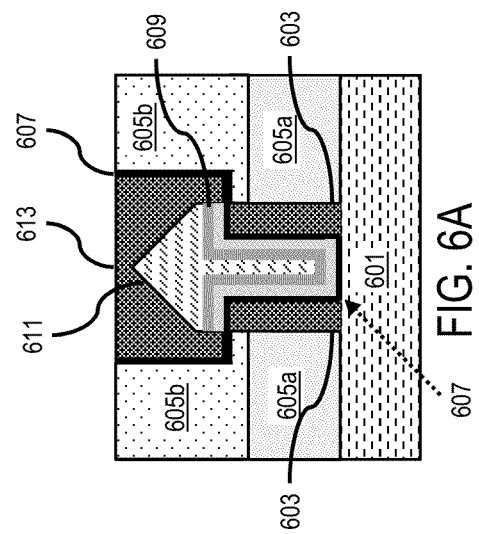

FIGS. 6A and 6B schematically illustrate additional options with respect to the process flows of FIGS. 3A through 3L and FIGS. 4A through 4Q, in accordance with embodiments of the present disclosure. For example, the structure in FIG. 6A reflects a structure that may result from the process flow of FIGS. 3A through 3L, including substrate 601, spacers 603, and oxide 605a and 605b. In addition, the structure in FIG. 6A includes high-k dielectric layer 607, metal liners 609, and metal gate structure 611, along with the spacers 603 and dielectric cap 613 over metal liners 609 and metal gate structure 611, all surrounded by oxide 605a and 605b. Adverting to FIGS. 3A through 3L, ILD 311 may be a flowable oxide to fill the gap between gates. However, since flowable oxide generally has poor CMP dishing performance as well as poor etch resistance against common etching solutions (e.g., a hydrofluoric acid solution), the flowable oxide may be etched and then re-filled with alternative materials having better CMP dishing performance and improved etch resistance (e.g., high-density plasma oxide). Thus, oxide 605a may be formed of flowable oxide, while oxide 605b may be formed of a different material (e.g., high-density plasma oxide). Moreover, as indicated, metal gate structure 611 may be formed of a number of materials, such as Al, silicide, W, or a combination thereof. Furthermore, the materials used to form spacers 603 (e.g., silicon nitride (SiN)) may be different from the materials used to form dielectric cap 613 (e.g. SiN, silicon carbide nitride (SiCN), silicoboron carbonitride (SiBCN), etc.). The materials used for dielectric cap 613 and spacer 603 may be formed of a material that would give high selectivity to high-density plasma oxide and flowable oxide.

The structure in FIG. 6B reflects a structure that may result from the process flow of FIGS. 4A through 4Q, including substrate 631, source/drain regions 633, oxide 637, and self-aligned contact 639. Additionally, the structure in FIG. 6B includes high-k dielectric layer 641, metal liners 643, and metal gate structure 645 between oxides 637 and self-aligned contact 639, along with dielectric cap 647 over metal liners 643 and metal gate structure 645. Moreover, the materials used to form spacers 635 may be different from the materials used to form dielectric cap 647.

The embodiments of the present disclosure can achieve several technical effects, including controllable metal recess with improved uniformity for devices across a wafer, from wafer-to-wafer, and from lot-to-lot. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a substrate;
   an interlayer dielectric (ILD) above the substrate;
   a metal gate above the substrate, the metal gate including a first region closer to the substrate, and a second region above the first region, the second region having a first portion closer to the first region and a second portion above the first region; and
   a gate cap between the ILD and the metal gate and above the metal gate at the second region, wherein:
   a first width of the first region is less than the first portion of the second region, and
   a second width of the second portion is less than a third width of the first portion.

2. The device according to claim 1, further comprising:
   spacers between the metal gate and the ILD at the first region.

3. The device according to claim 2, further comprising:
   a high-k dielectric layer between the spacers and the metal gate at the first region, between the ILD and the gate cap at the second region, and below the metal gate at the first region and the second region.

4. The device according to claim 1, further comprising:
   metal liners below and on opposite sides of the metal gate at the first region, and below the metal gate at the second region.

5. The device according to claim 1, further comprising:
   a first oxide on opposite sides of the metal gate at the first region;
   spacers between the metal gate and the first oxide at the first region;
   a second oxide above the first oxide and on opposite sides of the metal gate at the second region; and
   a gate cap between the second oxide and the metal gate and above the metal gate at the second region.

* * * * *